US007756659B2

(12) United States Patent
Morrill

(10) Patent No.: US 7,756,659 B2
(45) Date of Patent: Jul. 13, 2010

(54) DELAY STABILIZATION FOR SKEW TOLERANCE

(75) Inventor: David P. Morrill, Scarborough, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/972,997

(22) Filed: Jan. 11, 2008
(Under 37 CFR 1.47)

(65) Prior Publication Data
US 2009/0179673 A1   Jul. 16, 2009

(51) Int. Cl.
*G01D 18/00* (2006.01)
(52) U.S. Cl. .................. 702/89; 702/117; 702/118; 702/125; 702/176; 331/2; 331/46
(58) Field of Classification Search .................. 702/57, 702/64, 75, 85, 90, 106, 108, 117–118, 176–178, 702/182–183; 361/104; 327/138; 713/300
See application file for complete search history.

(56) References Cited
U.S. PATENT DOCUMENTS

| 6,642,758 B1 * | 11/2003 | Wang et al. .................. 327/156 |
| 6,683,503 B2 * | 1/2004 | Mizuno et al. ................. 331/46 |
| 6,965,520 B1 * | 11/2005 | Seshadri et al. .............. 365/145 |
| 7,406,101 B1 * | 7/2008 | Obeidat et al. ............... 370/503 |
| 2001/0052867 A1 * | 12/2001 | Ureshino ..................... 341/144 |
| 2004/0201939 A1 * | 10/2004 | Shipton et al. .............. 361/104 |
| 2005/0077943 A1 * | 4/2005 | Kakuda et al. ............... 327/277 |
| 2005/0195305 A1 * | 9/2005 | Lyu et al. ..................... 348/308 |
| 2006/0259258 A1 * | 11/2006 | Shipton et al. ................. 702/81 |
| 2006/0271801 A1 * | 11/2006 | Kano .......................... 713/300 |
| 2008/0179706 A1 * | 7/2008 | Kim et al. .................... 257/529 |
| 2008/0204119 A1 * | 8/2008 | Hardy et al. ................. 327/525 |

* cited by examiner

*Primary Examiner*—Eliseo Ramos Feliciano
*Assistant Examiner*—Mi'schita' Henson
(74) *Attorney, Agent, or Firm*—Cesari and McKenna, LLP; Edwin H. Paul, Esq.

(57) ABSTRACT

In an integrated circuit with at least two separate timing circuits, for example both a serializer and a deserializer, a trim value correction factor is developed and applied at the testing of the chip. The correction trim value brings the VCO frequency of the serializer into specifications, but the trim value may also be used to alter the delay between a received clock and data in the deserializer. Since both the serializer and the deserializer were made with the same process, the received clock delay may be corrected by substantially the same correction factor as that applied to the VCO. Illustratively the trim values may be stored on the IC.

14 Claims, 4 Drawing Sheets

| PROCESS SPEED | TRIM SETTING | VCO FREQUENCY | CONTROL VOLTAGE |
|---|---|---|---|
| FAST | A1 | F1 + 25% | V1 |
| --- | --- | --- | --- |
| TYP | X | F1 | V2 |
| --- | --- | --- | --- |
| SLOW | B1 | F1 - 25% | V3 |

DELAY STABILIZATION FOR SKEW TOLERANCE

BACKGROUND OF THE INVENTION

1. Field of the Invention

The present invention relates to trimming an integrated circuit product to better meet specifications, and more particularly to trimming to compensate for process related timing variations.

2. Background Information

Often ICs (integrated circuits) have a number of separate timing circuits built onto one chip. Such timing circuits may include clocks, timing chains, delays and combinations of these and similar timing circuits. As discussed below ICs in practical applications are subject at least to temperature, power supply and process related variations that affect the performance of the circuits on the ICs. When these ICs are being fabricated they are tested under known temperature and power supply conditions so that process related performance differences may be measured, and when out of specification, the chips may be discarded.

One typical IC with separate timing circuits is a serializers/deserializers (SerDes) where a computer system parallel loads a shift register with a data word. The computer system will then trigger, strobe or otherwise start a clock circuit. The clock circuit provides a clock that shifts out the data word one bit at a time. The stream of data bits is sent along with the clock signal to a deserializer. The clock is synchronized to the data signals as they travel and, typically, the clock is used by the deserializer to reliably strobe or load in data, one bit at a time.

Since the clock and the data travel together but in different cables, there may be some skew between the two signals as they are received at a deserializer. To compensate for the skew, usually, the clock is delayed in the deserializer in order to ensure that a clock edge occurs when the data signal is stable. The sequence of delayed clock edges are then used to strobe the data, bit by bit, into a receiving register.

As known to those skilled in the art, the deserializer must be able to reliably receive a data word. Designers will usually send framing bits that surround the data word bits that are sent asynchronously. In this case, by recognizing the framing bits, the beginning and ending of a data word (or byte, etc) are distinguished so that the data word may be reliably retrieved. In the art other techniques are known, including synchronously sending data word bits in a continuous stream with no framing bits but using filler data words.

FIG. 1 illustrates a block diagram of a single IC (integrated circuit) having both a serializer and a deserializer. In this case there are two separate timing circuits, a VCO providing a clock in the serializer and a delay chain in the deserializer. The VCO (voltage controlled oscillator) is started by a strobe signal, STB, that is provided by a computer system that also loaded a parallel data word into a shift register. The VCO clock then shifts out the data word, bit by bit. Coincidently with the data bits, the clock is output on another line. The receiving circuit may use the clock signal to reliably load in the bits.

FIG. 1 includes a deserializer control that accepts a received clock and serial data. The deserializer control delays the clock with respect to the data bit so that the data is stable when the delayed clock loads the data bit by bit into the register. When the full data word is received, the parallel data word is signaled as available to the computing system by the WORD CLK.

As also known to those skilled in that art, performance of electronics on a chip is subject to change due, at least, to variations in operating supply voltage, temperature and fabrication processes. In practice, when a serializer/deserializer IC is fabricated, it is tested. One common test is to run the VCO or other such clock generating circuit and measure its frequency. In this testing, the temperature and the supply voltage are held at known values so that their variations are not operative. However chip to chip process variations will affect the clock frequency.

For example, if the clock frequency is too low due to a "slow" process, the delay in a receiving deserializer may be too long relative to typical process and the timing of the clock and data bit at the receiver may be subject to errors. If the clock frequency is too fast the receiver may again be subject to errors. Process differences may account for as much as a 30% fallout of ICs when tested.

IC designers can specify performance variations due to temperature, supply voltage and process differences under which the IC should reliably operate. Since the designers of an IC can anticipate the performance variations of an IC due to temperature and supply voltage changes, a specification for an acceptable range of VCO frequencies of circuits as they leave the production operation may be developed. For example, the clock frequency may be specified as some center frequency plus or minus an allowable variation. The clock operating at the edges of (and anywhere within) the allowed range will perform reliably over the temperature and supply voltage variations that are published for the IC product.

One limitation in the art is that trimming the VCO clock in a serializer to be within a specified frequency range does not compensate for the same process variations that affect the clock delay in the deserializer.

SUMMARY OF THE INVENTION

Although this discussion details a serializer/deserializer on an IC, the present invention applies to any IC that might have at least two separate timing circuits, e.g., clocks, timing chains, delays, combinations thereof, or other such similar timing circuits. In such circuits the fabrication process will be the same for all the timing circuits, so any correction factor or trim factor determined for one timing circuit will also apply to other timing circuits. For example, if an IC contains two or more one-shot delay circuits, a correction factor applied to one one-shot to bring it into its specified time delay can be applied to the others in order for all the one shots to be within their specified time delays.

In one illustrative application an IC containing at least two separate timing circuits has a time specification for at least the first timing circuit. When the timing specification is not met a trim or correction value may be determined. Illustratively, a first variable control circuit controls the timing of the first timing circuit, and the trim value is input to the first control circuit to modify or change the performance of the first timing circuit to bring the performance into specifications. When a second timing circuit is present it may be trimmed using the same trim value.

In one illustrative example, a set of performance parameters (like frequency of a clock) that lie outside a test specification may be correlated to a set of trim values that may stored within a memory area on the IC. In such a case the trim value may be enabled when the IC is tested and applied to compensate for the performance parameter that was outside the specification. However, in addition that same trim value may be also applied to virtually any other timing circuit resident on the same IC. The present invention provides this capability.

With respect to a serializer/deserializer the present invention addresses and reduces the test fall out by trimming the serializer VCO clock frequency to be within an acceptable range, and then uses that same trim information to trim the received clock delay within the deserializer. Since the VCO clock in the serializer and the delay circuit in the deserializer received clock are subject to the same process (since they are on the same chip) the trim factor for the VCO clock frequency will also be a usable trim or correction factor for the delay circuit. The present invention recognizes this correlation to advantage.

In an illustrative embodiment, the VCO frequency may be measured as being outside of the frequency specification. The VCO frequency may be changed to be within the test specification by introducing a trim value that, in this example, changes the control voltage that determines the VCO frequency. That trim value may be a set of binary bits that preferentially, when activated, opens fuses within the IC or to permanently turn on or off switches that set the control voltage for the VCO.

Once the VCO initial frequency is measured, the offset from an acceptable frequency is known. The offset may be expressed as the value of the set of binary bits and that value will indicate which fuses must be opened to bring the VCO frequency within the specification. That value is also a measure or how slow or fast the process that made the IC under test is away from an acceptable process.

When a deserializer is formed on the same IC as a serializer, and the VCO for the serializer has been trimmed to account for a too fast or too slow process, that same too fast or too slow process also was used to create the deserializer, and the same trim value is a measure of the deserializer being too fast or too slow. Under these circumstances the trim value for the VCO may be used to trim the clock delay so that the deserializer will perform within specifications.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which:

FIG. 3B is a representative table of trim values for slow, typical and fast processes;

DETAILED DESCRIPTION OF AN ILLUSTRATIVE EMBODIMENT

Figure 1:
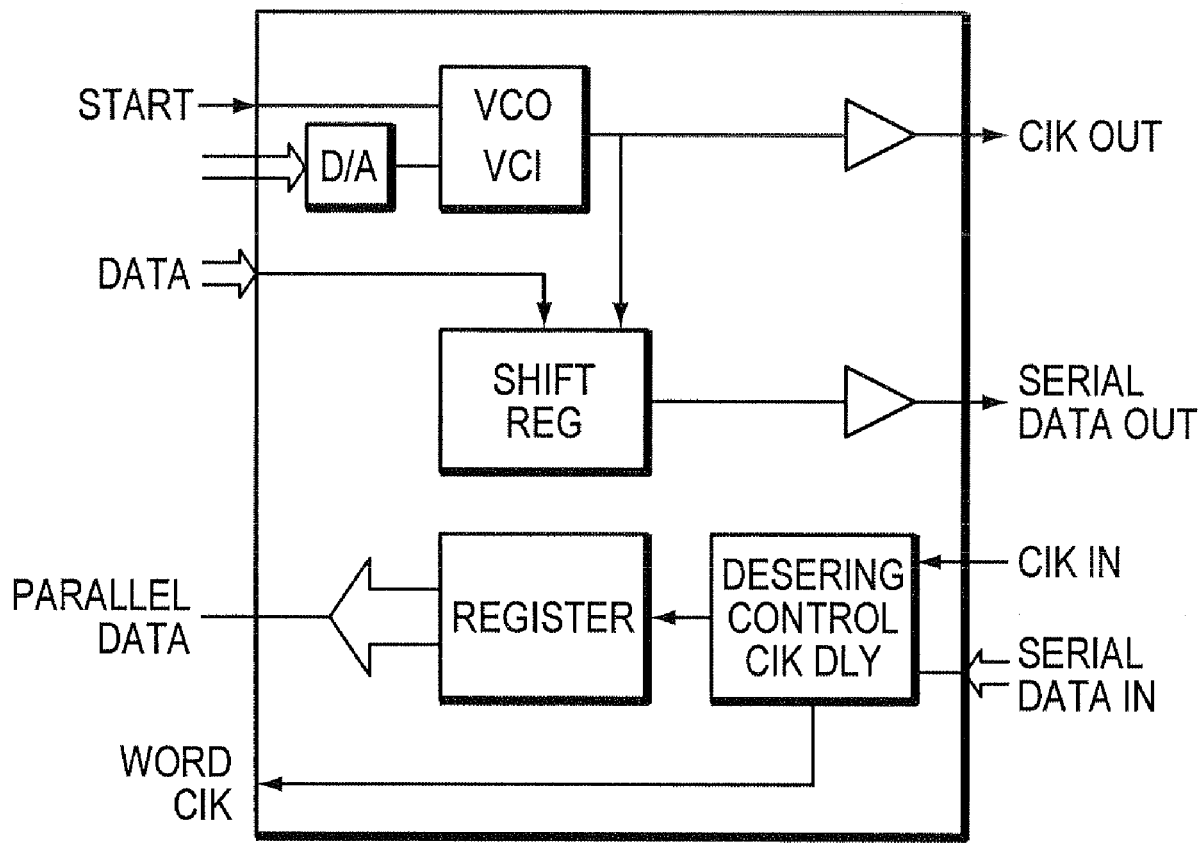
FIG. 1 is a schematic block diagram of a common prior art serializer/deserializer.

FIG. 1 illustrates a VCO with a control voltage, VC1, that is the voltage that controls the frequency of the VCO. In this instance a START signal may be used to start the oscillator. Detailed designs of this type are known in the art.

Figure 2A:
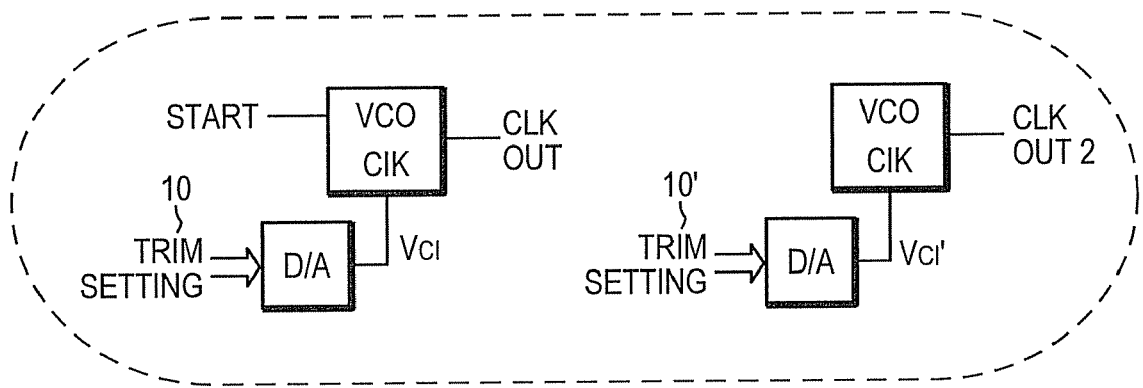
FIGS. 2A, 2B and 2C are block diagram/schematics of the VCO with a control input.

As mentioned before, the VCO frequency may be trimmed to a different value by trimming or changing the control voltage (VC1, the 'Voltage Controlled' in VCO) in order to meet a test performance specification. FIG. 2A illustrates two timing or clock circuits on the same chip. In one case the CLK OUT frequency is measured and if found to be too fast, the trim settings 10 may be set to bring the frequency within specifications. Once the CLK OUT frequency is set, the trim settings 10 are duplicated for the trim setting 10' to generate a VC1' that will change the CLK OUT 2 frequency proportionally.

Figure 2B:
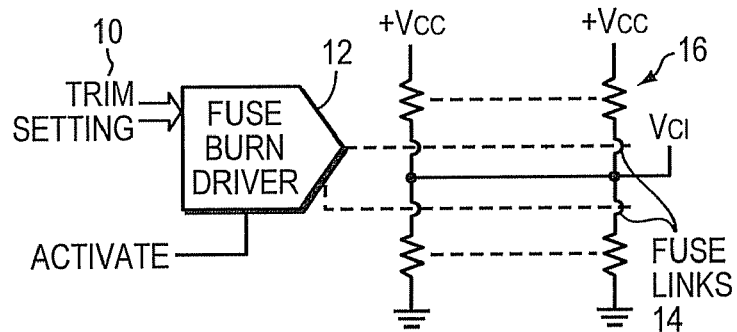

FIG. 2B illustrates a D/A with an input of a trim setting that may be used to generate the VC1 and VC1' correction signals. The fuse burn driver 12 will selectively activate driver circuits to open some fuses 14 and thereby change the value of VC1 by a known amount. If the VCO is too slow a different set of trim settings will speed up the VCO, illustratively by raising VC1. For example, the basic design of the VCO will determine the sensitivity of the VCO frequency to the VC1 value, and the design of the trim setting voltage divider resistors 16 will change VC1 by a known value that, in turn, will change the VCO frequency by a known value. The fuse burn driver 12 will blow the fuses 14 to form a resistance divider for a known VC1 that will bring the VCO frequency into the specification. The VCO frequency then is measured again to ensure that the VCO frequency is within specifications.

Figure 2C:
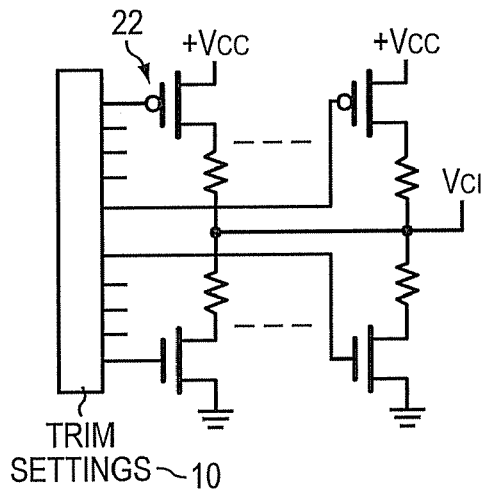

Another approach, shown in the dotted lines of FIG. 2C shows a set trim setting that turns on or off MOS switches 22 that also form a resistance voltage divider that are set from +Vcc to ground. Again, the value of VC1 will be determined by the trim settings 10 and the value of VC1 will determine the VCO frequency.

In this illustrative embodiment, the VCO frequency slows down when the VC1 falls in value and speeds up when VC1 rises in value. FIG. 3 illustrates the relationship. As known to those skilled in the art, the frequency of the VCO may be determined by a capacitor charging up. The quicker (and thus the shorter) the voltage on the capacitor travels (due to a higher charging current that results from a higher VC1) to a triggering voltage, the shorter the cycle will be and so the higher the VCO frequency. Illustratively, this case, VC1 to VCO frequency will be an direct relationship.

Figure 3A:
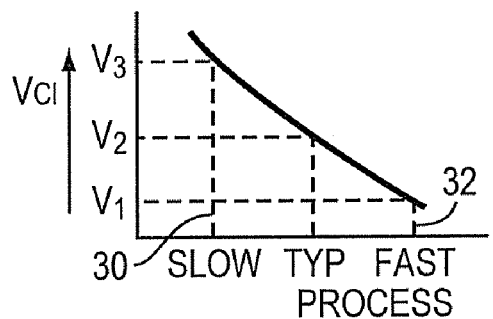
FIG. 3A is a chart of the control voltage versus process speeds.

FIG. 3A illustrates a practical relationship between the process speed and the control voltage VC1 for the VCO. For example, in FIG. 3A the vertical axis represents a value for VC1 that will compensate for a slow or fast fabrication process. If the VCO due to the fabrication process was too slow at location 30 in FIG. 3A, raising VC1 to V3 will increase the VCO frequency into specification. Similarly, if the VCO frequency was too fast, as in location 32, lowering VC1 to V1 will lower the frequency into specification. V2 would represent the non-trimmed value for VC1 that would produce a frequency well within specifications for a VCO fabricated with a typical process. From the frequency test, the trim setting 10, say a binary value of say B1, that speeds up the VCO frequency into a usable range might be read directly from the graph in FIG. 3A. That same binary value B1 will be applied to the trim settings 60 which will open circuit selected fusable links 14 as in FIG. 2A or turning on or off selected switches 22 in FIG. 2C.'

The trim value may also be stored in memory within the IC and enable when the performance test is done. For example, as illustrated in FIG. 3B, a table may be formed where trim settings 10 are stored and related to process speeds, for example FAST, TYP and SLOW. B1 might be the trim setting to speed up timing circuits produced by a slow process, and A1 to slow down timing circuits. X may be the normal setting and there may be a number of other values distributed between A1 and B1. The table in FIG. 3B is completed showing possible ranges for, for example, the VCO frequency being 25% away from the center or expected frequency F1. Here the test specification may allow a 5% variation from F1, but these numbers are simply illustrative.

Figure 5A:
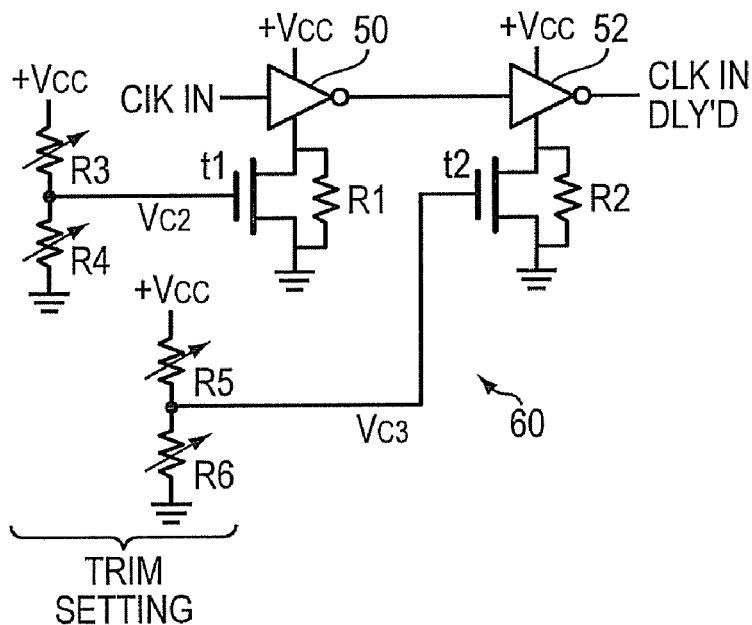
FIGS. 5A and 5B are schematics of a delay chain.

In FIG. 5A, higher VC3 and VC4 will act to turn on the NMOS transistors and lower the ground impedance of the inverters and speedup the inverters. So in this embodiment, if the VC1 is raised to speed up the VCO frequency, VC3 and VC4 are raised the delay of the inverters 50 and 51 is correspondingly shortened. Since the same process that produced the serializer VCO on the chip also produced the deserializer on the chip, if the VCO is slow or fast and must be sped up or slowed down, the standard delay in the deserializer will also be, respectively, too slow or too fast and must be sped up or slowed down by substantially the same factor as was the VCO frequency. In practice if the VCO is made faster by 20%, the delay must be made faster by substantially the same 20%. Simply stated if VC1 is lowered to speed up the VCO frequency, VC2 and VC3 are lowered proportionally to shorten the delay. In other illustrative circuits the operation of the control signals may be different, but with the same effect.

Figure 4:
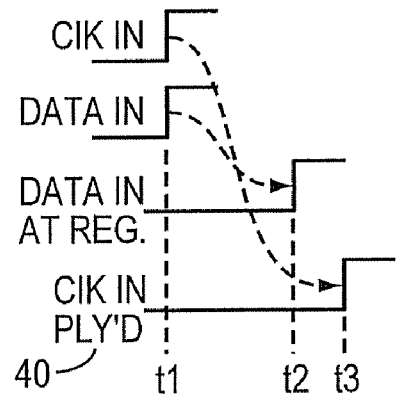
FIG. 4 is a timing diagram showing the clock and data in a deserializer.

FIG. 4 illustrates a delay of the clock within the deserializer portion of the IC. Here the CLK IN and the DATA BIT IN leading edges arrive at the same time, t1. The DAT BIT IN travels incurring some delay and is presented to an input to, typically, a shift register. The CLK IN DLY is a delayed CLK IN signal, and is used to clock the data bit into the shift register. As shown, the CLK IN DLY 40 must be delayed longer than the DATA BIT IN or the correct data may not be loaded into the shift register.

FIG. 5A illustrates a delay circuit that may be used to delay the CLK IN signal of FIG. 4. Here two inverters are set in series. The CLK IN to the gate of the first inverter 50 and its output connects to the gate of the second inverter 52. The output of inverter 52 is the CLK IN DLY.

Inverter 50 has in its ground connection the N-type CMOS T1 in parallel with R1, and invert 52 has T2 in parallel with R2. In each case an impedance in the ground connection will limit the output drive current of the inverter and this will slow down each inverter. For inverter 50 the largest impedance in its ground path will be R1 and that will represent the slowest performance of inverter 50. For T2, R2 represents the slowest performance. The parallel transistors may be activated to speed up the inverters. As illustrated, if VC2 is raised, T1 will be turned on, reducing the ground connection impedance and shortening the delay of inverter 50. Similarly, turning on T2 will shorten the delay for inverter 52.

Shown functionally in FIG. 5A, the gate of T1 is driven by VC2 which is illustrated as a resistor divider of variable resistors R3 and R4 between +Vcc and ground. For the gate of T2, VC3 is illustrated a resistor divider of variable resistors R5 and R6. In this representation the variable resistors represent the result of the fusable links or switches in FIGS. 2B and 2C, and as mentioned above, the values of these variable resistors will be derived from trim setting for VC1.

Figure 5B:
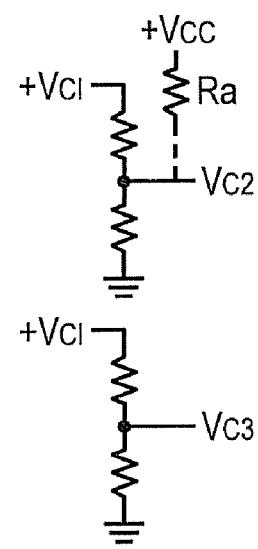

In another embodiment shown in FIG. 5B, the control voltage VC1 itself might be used directly through a resistor divider to drive the gates of T1 and T2. If additional offset was needed, an additional resistor Ra to Vcc may be used, with the understanding that the Vcc will be specified to change as part of the product specification. Such calculations are well within the skill of those skilled in the art.

In one case it was found that, when the skew between a received CLK edge and a data edge is as high as ±200 picoseconds, the corresponding deserializer delay will reliably clock in a data signal even over the specified temperature and power supply variations.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. An integrated circuit comprising:
at least first and second separate timing circuits that are created by the same fabrication process; wherein a first timing circuit is a clock and a second timing circuit is a delay circuit;
a time specification for an at least first timing circuit is known,
a first variable control circuit that controls the timing of at the least first clock timing circuit;
a driver that outputs a control signal to the first variable control circuit;
a trim value that is related to the fabrication process,
wherein when the at least first timing circuit does not meet its time specification;
the trim value is determined and applied to the driver so that the at least first timing circuit meets its timing specification;
a second variable control circuit that controls the timing of a second timing circuit; and
a second driver that outputs a second control signal to the second variable control circuit, wherein the trim value is applied to the second driver thereby trimming the timing of the second timing circuit to meet its timing specification, wherein the application of the trim value to the at least first and second timing circuits corrects for process, temperature and voltage variations.

2. The integrated circuit of claim 1 wherein the trim value controls the timing of both the at least first and the second timing circuits proportionally.

3. The integrated circuit of claim 1 wherein the timing circuits comprise a serializer/deserializer, wherein a clock is provided in the serializer and a delay circuit for a received clock is provided in the deserializer.

4. The integrated circuit of claim 3 wherein the clock comprises a voltage controlled clock, and wherein the driver is a digital to analog converter comprising a circuit with fuses, wherein the trim value determines which the fuses are selectively blown in response to the clock frequency being outside the limits.

5. The integrated circuit of claim 4 wherein the digital to analog converter comprise transistor switches that selectively connect resistors between a power supply and ground as determined by the trim value and wherein the resulting variable control voltage brings the clock frequency into the limits.

6. The integrated circuit of claim 3 wherein the driver comprises fuses the connect resistors to a power supply and to ground, the resistors and fuses forming a resistor divider wherein the resistor divider outputs the variable control signal, wherein a trim value, when applied to the driver, selectively blows fuses to change the output of the resistor divider and thus the variable control signal.

7. The integrated circuit of claim 3 wherein the driver comprises transistor switches that connect resistors to a power supply and to ground, the resistors and transistor switches forming a resistor divider wherein the resistor divider outputs the variable control signal, wherein a trim value, when applied to the driver, selectively activates the transistor switches to change the output of the resistor divider and thus the variable control signal.

8. The integrated circuit of claim 1 wherein the trim value is stored as a table within the integrated circuit.

9. A method for trimming an integrated circuit containing at least two separate timing circuits, wherein a first timing circuit is a clock and a second timing circuit is a delay circuit; wherein a time specification for at least a first timing circuit is known, the method comprising the steps of:
    creating the at least two timing circuits by the same fabrication process; wherein the fabrication process may be typical, fast, or slow;
    measuring the timing of at least first timing circuit; wherein the timing of the at least first timing circuit may be typical, too fast, or too slow;
    determining a trim value that is related to the fabrication process speeds;
    changing the timing of the at least one timing circuit to meet its time specification by applying the trim value to a first variable control circuit that controls the timing of the at least first timing circuit; and
    changing the timing of a second timing circuit to meet its time specification by applying the trim value to a second variable control circuit that controls the timing of the second timing circuit, wherein the application of the trim value to the at least first and second timing circuits corrects for process, temperature and voltage variations.

10. The method of claim 9 wherein the at least two separate timing circuits comprise a clock in a serializer, and a delay circuit in a deserializer, wherein the method further comprises the steps of:
    measuring the clock frequency, wherein when the clock frequency is outside the limits, a specific trim value is developed that will change the clock frequency to meet the limits;
    applying the specific trim value to change the clock frequency;
    variably controlling the delay of the delay circuit;
    applying the specific trim value to the variable delay circuit wherein the received clock delay is changed and may be reliably used to load received data.

11. The method of claim 10 wherein the clock is a voltage controlled oscillator controlled by a digital to analog converter, and wherein the step of applying the trim value comprises the step of selectively blowing fuse links in the digital to analog converter thereby changing the output of the digital to analog converter.

12. The method of claim 10 wherein the clock is a voltage controlled oscillator controlled by a digital to analog converter, and wherein the step of applying the trim value comprises the step of selectively activating and deactivating transistor switches in the digital to analog converter thereby changing the output of the digital to analog converter.

13. The method of claim 9 wherein the step of determining a trim value comprises the step of accessing a stored table with trim values.

14. A method for fabricating an integrated circuit, the method comprising the steps of:
    creating at least first and second timing circuits, wherein a first timing circuit is a clock and a second timing circuit is a delay circuit, made by the same fabrication process; wherein the fabrication process may be fast, slow or typical process, wherein the at least first and second timing circuits each have a timing specification;
    measuring the timing of the first timing circuit; wherein the timing of the first timing circuit may be typical, too fast, or too slow with respect to its timing specification;
    determining a trim value that is related to the fabrication process speeds;
    applying the trim value to a first variable control circuit that controls the timing of the first timing circuit, wherein the first timing circuit meets its timing specification; and
    applying the trim value to a second variable control circuit that controls the timing of the second timing circuit, wherein the second timing circuit meets its timing specification, wherein the application of the trim value to the at least first and second timing circuits corrects for process, temperature and voltage variations.

* * * * *